(12) United States Patent
Onoda et al.

(10) Patent No.: US 6,631,907 B1
(45) Date of Patent: Oct. 14, 2003

(54) NITRIDE-PLATED PISTON RING FOR INTERNAL COMBUSTION ENGINES

(75) Inventors: Motonobu Onoda, Yono (JP); Katsuaki Ogawa, Yono (JP); Kazuo Shimizu, Yono (JP)

(73) Assignee: Nippon Piston Ring Co., Ltd., Tokyo (JP)

( * ) Notice: Subject to any disclaimer, the term of this patent is extended or adjusted under 35 U.S.C. 154(b) by 0 days.

(21) Appl. No.: 08/578,996

(22) Filed: Dec. 27, 1995

(30) Foreign Application Priority Data

Dec. 27, 1994 (JP) .............................. 6-324621

(51) Int. Cl.$^7$ ................................. F16J 9/20
(52) U.S. Cl. ....................... 277/443; 277/444
(58) Field of Search ............................ 277/227, 235 A, 277/434, 442, 443, 444; 428/698, 457, 699

(56) References Cited

U.S. PATENT DOCUMENTS

| | | | | |
|---|---|---|---|---|
| 4,818,351 A | * | 4/1989 | Arai et al. ..................... | 204/39 |
| 4,966,751 A | * | 10/1990 | Kaede et al. .................. | 420/34 |
| 5,154,433 A | * | 10/1992 | Naruse ................... | 277/235 A |
| 5,316,321 A | * | 5/1994 | Ishida et al. ............. | 277/235 A |
| 5,851,659 A | * | 12/1998 | Komuro et al. ............. | 428/336 |

FOREIGN PATENT DOCUMENTS

| | | | |
|---|---|---|---|
| GB | 2243162 | | 10/1991 |
| JP | 4-368 | | 1/1992 |
| JP | 6-248425 | * | 9/1994 |
| JP | 7-216534 | * | 8/1995 |

* cited by examiner

Primary Examiner—D. DePumpo
(74) Attorney, Agent, or Firm—Birch, Stewart, Kolasch & Birch, LLP

(57) ABSTRACT

According to an embodiment of the present invention a piston ring for internal combustion engines for use with a piston and a cylinder, is provided that has an external circumferential sliding surface adapted to slid against the internal wall of the cylinder. The piston ring has an ion-plating deposition layer formed over the externtal circumferential sliding surface, the deposition layer having pores and being made of a mixture of a first chromium nitride of CrN type and a second chromium nitride of $Cr_2N$ type. The mixing ratios in the mixture are more than 45.5 and less than 98.0 weight percent for the first chromium nitride and the balance portion for the second chromium nitride. According to another embodiment of the present invention, a piston ring for internal combustion engines for use with a piston and a cylinder, is provided that has an external circumferential sliding surface adapted to slid against the internal wall of the cylinder. The piston ring having an ion-plating deposition layer formed over the external circumferential sliding surface thereof, the deposition layer having pores and being made of a mixture of a first chromium nitride of CrN type, a second chromium nitride of $Cr_2N$ type, and metallic chromium. The mixing ratios in the mixture are more than 45.0 and less than 98.0 weight percent for the first chromium nitride, more than 0.5 and not more than 15.0 weight percent for the metallic chromium, and the balance portion for the second chromium nitride. According to a further embodiment of the present invention, the ion-plating deposition layer formed over the external circumferential sliding surface of the piston ring, made of the mixture described in the above embodiments, is formed to have porosity of more than 0.5 and not more than 20.0 percent.

4 Claims, 6 Drawing Sheets

NITRIDE-PLATED PISTON RING FOR INTERNAL COMBUSTION ENGINES

FIELD OF THE INVENTION

The present invention relates to a surface treatment for a piston ring for use in internal combustion engines.

BACKGROUND OF THE INVENTION

Recently, as internal combustion engines tend to have higher performance, an extended life for such internal combustion engines is in strongly demand, while the functional components of the engine are burdened with ever increasing severe conditions. Piston rings are accordingly being exposed more often than before to severe environments such as high engine revolution, high temperature, and high bearing pressure, whereby higher durability is being required of such piston rings.

Furthermore, demand for higher engine performance and a smaller engine size exists, which causes various combinations of piston rings to be employed in diesel and gasoline engines; such combinations include a combination of three compression rings and two oil rings, a combination of three compression rings and one oil ring, a combination of two compression rings and one oil ring, and a combination of one compression ring and one oil ring, where compression rings and oil rings constitute respective aspects of piston rings. As a means to improve durability of piston rings, abrasion resistance treatments are being applied to the sliding surface of the piston rings, that include hard chrome plating and nitriding.

Abrasion resistance of piston rings with a conventional chrome-plated layer is insufficient for operating conditions; A nitriding treatment provides excellent abrasion resistance, where it is used as a surface treatment for the first compression ring (top ring) which is used under severe operating conditions, and tends to. Nitriding treatments employed in conventional piston rings are not sufficient from the view point of abrasion resistance, scuffing resistance, and aggressive-proofness (capability of treatment not being aggresive against the counterpart of the piston, i.e. adjacent cylinder wall material).

Therefore, an object of the present invention is to provide a piston ring for internal combustion engines that has excellent abrasion resistance and scuffing resistance, and is capable of decreasing its aggressiveness as much as possible (i.e. capable of having excellent aggressive-proofness).

SUMMARY OF THE INVENTION

In order to accomplish the object described above, a piston ring is provided, according to an embodiment of the present invention, such that the piston ring, implemented either as a compression ring or oil ring, has an ion-plating deposition layer formed over the external circumferential sliding surface thereof. The deposition layer is made of a mixture of a first chromium nitride of CrN type and a second chromium nitride of $Cr_2N$ type, the mixing ratios in the mixture being more than 45.0 and less than 98.0 weight percent for the first chromium nitride and the remaining weight percent portion for the second chromium nitride.

According to another embodiment of the present invention, a piston ring is provided such that the piston ring, implemented either as a compression ring or oil ring, has an ion-plating deposition layer formed over the external circumferential sliding surface thereof, wherein the deposition layer is made of a mixture of a first chromium nitride of CrN type, a second chromium nitride of $Cr_2N$ type, and metallic chromium. The mixing ratios in the mixture being more than 45.0 and less than 98.0 weight percent for the first chromium nitride, more than 0.5 and not more than 15.0 weight percent for the metallic chromium, and the remaining weight percent portion for the second chromium nitride.

According to a further embodiment of the present invention, the ion-plating deposition layer formed over the external circumferential sliding surface of the piston ring, made of the mixture described in the above embodiments, is formed to have porosity of more than 0.5 and not more than 20.0 percent.

Thus, according to the present invention, a piston ring for internal combustion engines, is obtained that advantageously has excel lent abrasion resistance, scuffing resistance, aggressive-proofness, and peeling-proofness, thereby enabling demands to be satisfied for internal combustion engines of higher performance.

DETAILED DESCRIPTION OF THE INVENTION

Figure 1:
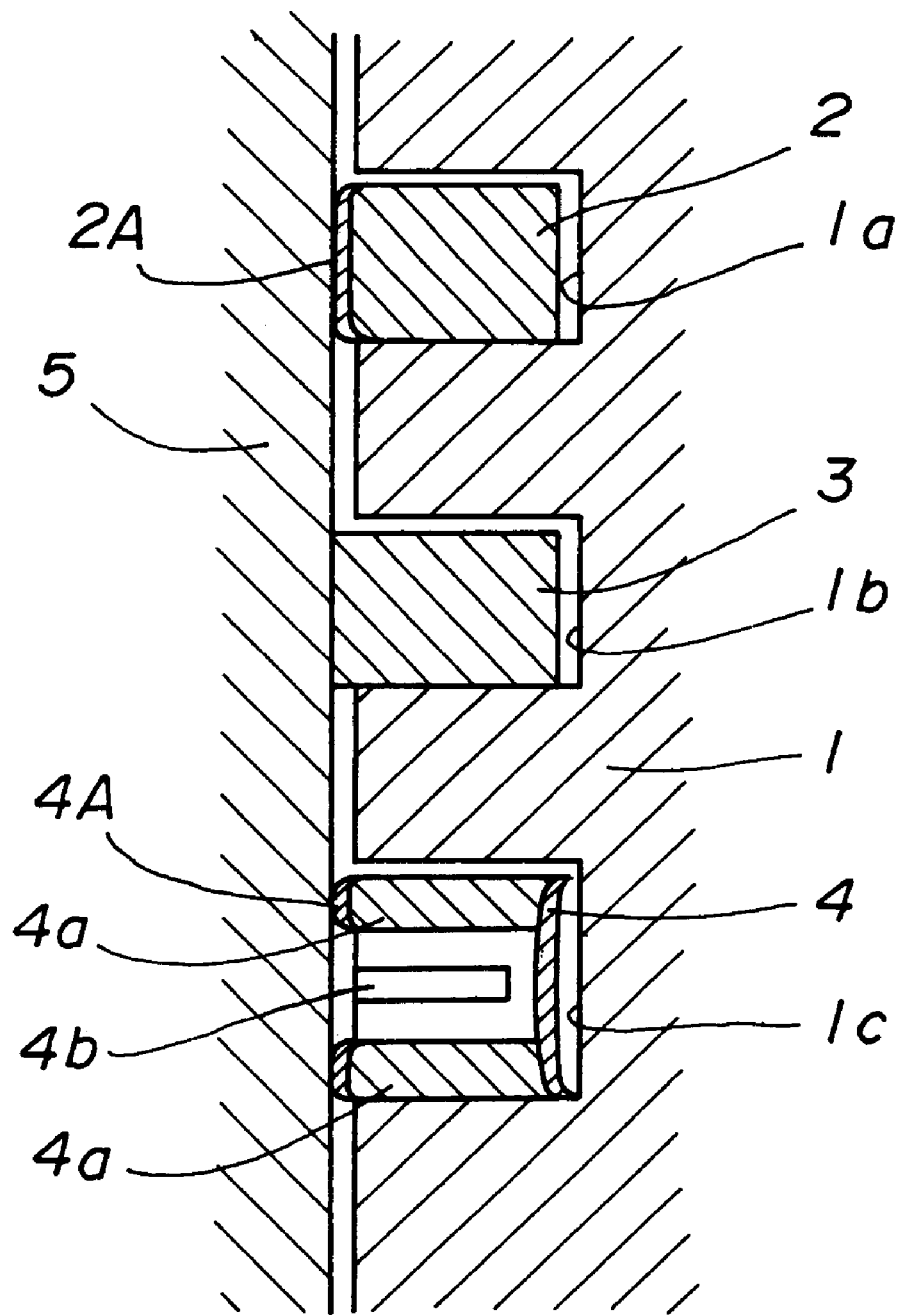
FIG. 1 is a partial, cross-sectional view of piston rings in accordance with an embodiment of the present invention, to show an arrangement where the piston rings are engaged with a piston and a cylinder for an internal combustion engine.

Properties of Ion-plating Deposition Layer Made of Nitride Mixture

Shown immediately below is a table for various properties of CrN and $Cr_2N$, from which it may be understood that both CrN and $Cr_2N$ are hard and brittle when used individually.

|  | $Cr_2N$ | CrN |
| --- | --- | --- |
| Theoretical Density (g/cm3) | 6.51 | 6.14 |
| Hardness Hv (kg/mm2) | 1,800–2,500 | 1,500–2,200 |
| Modulus of Elasticity (kg/mm2) | approx. 35,000 | approx. 25,000 |

Thus, in the case where a single ion-plating deposition layer of either $Cr_2N$ or CrN, formed by a PVD method, is individually used, breaking and peeling of the layer occur frequently due to poor workability during the processes of grinding and polishing, thereby significantly reducing a non-defective ratio. In addition, when finished piston rings having such a layer are used in internal combustion engines.

These rings are extremely fragile and are sensitive to dynamic and thermal impacts occurring in the operation, which tend to cause breakage, thereby disabling excellent abrasion resistance and scuffing resistance thereof.

In contrast to the above, in an ion-plating deposition layer made of a mixture of nitride within a mixing range specified according to an embodiment of the present invention, CrN having lower hardness and lower modulus of elasticity out of the two kinds of nitride mentioned above, is contained by not less than 45.0 weight percent and the balance portion is allocated to $Cr_2N$. $Cr_2N$ is of hexagonal system and CrN is of the cubic system. They are different in their crystal systems, and therefore, the crystals of the two kinds of nitride are complexly twined with each other to form the ion-plating deposition layer. Thereby, an excellent sliding member may be obtained that has impact resistance and toughness. Both nitrides improve without imparing the characteristics of the ion-plating deposition layer made of a single kind of nitride of CrN that has the most excellent abrasion resistance and scuffing resistance, whereby an excellent sliding member is obtained, and eliminates defects such as chipping, peeling and breaking.

However, because the abrasion resistance of the ion-plating deposition layer made of a single kind of nitride of $Cr_2N$ is lower compared with that of the ion-plating deposition layer made of a single kind of nitride of CrN, in an ion-plating deposition layer made of a mixture of the two kinds of nitride where the ratio for CrN is not more than 45.0 weight percent, its abrasion resistance is lowered, and its layer adherence is made extremely low. Conversely, even if the mixing ratio for CrN is increased to 98.0 weight percent or more, an abrupt increase in either abrasion resistance or layer adherence cannot be expected.

Also, according to another embodiment of the present invention, by causing Cr to be contained by more than 0.5 and less than 15.0 weight percent in the ion-plating deposition layer made of the mixture of the two kinds of nitride, (i.e. by causing the metallic Cr to be in the intercrystal grain boundary of the ceramic), the intercrystal adhesive strength is reinforced so that the toughness of the ion-plating deposition layer is improved. Because of effect of this, elimination of defect such as chipping, peeling and breaking of the layer is achieved.

Containing Cr by not more than 0.5 weight percent however, has no such effect. Conversely containing Cr by more than 15.0 weight percent causes scuffing resistance to be reduced.

The toughness of an ion-plating deposition layer is also greatly influenced by porosity of the layer. Therefore, increasing the porosity of the ion-plating deposition layer to be more than 0.5 and not more than 20.0 percent, eliminates chipping, peeling and breaking of the layer.

With the porosity of 0.5 percent or less, however, the layer is affected to have high density and to be brittle, which in turn tends to cause chipping and peeling of the layer. Conversely, in the case where the porosity is more than 20.0 percent, the ion-plating deposition layer itself has a reduced strength and becomes somewhat corruptive, whereby its abrasion resistance is reduced.

Specific Examples of Piston Rings According to the Invention

Referring to FIG. 1 through FIG. 6, some illustrative piston rings for internal combustion engines, according to the present invention, are described hereinbelow.

FIG. 1 shows piston rings in accordance with an embodiment of the present invention, as engaged with a piston and a cylinder for an internal combustion engine. The piston 1 has three circular grooves 1a, 1b, and 1c formed therein, where three piston rings, specifically, in the order from near to far from the combustion chamber (not shown) of the engine, a first compression ring 2 (i.e. top ring), a second compression ring 3, and oil ring 4 are fitted respectively. The oil ring is a combination type oil ring comprising two side rails 4a and one spacer expander 4b.

The base material for the compression rings 2 and 3 is made of stainless steel (17-Cr stainless steel), and the base material for the siderails 4a of the oil rings 4 is also made of stainless steel (13-Cr stainless steel). Respective external circumferential surfaces of the rings 2, 3, and 4 slidably contact a cylinder, specifically, a cylinder liner 5. Formed over the respective external circumferential surfaces of the first compression ring 2 and the oil ring 4 are ion-plating deposition layers 2A and 4A. The ion-plating deposition layer 2A over the external circumferential surface of the first compression ring 2 is so formed for the purpose of improving abrasion resistance, scuffing resistance, and aggressive-proofness because the first compression ring 2 encounters the most significant abrasion among the rings.

As for the oil ring 4, if the ring is abraded, its oil scraping action is lost, thereby increasing the oil rise and resulting in an increased consumption of lubricating oil. The loss of its oil scraping action also causes lubricating oil to flow into the,combustion chamber, thereby adversely affecting the combusting state. Thus, an ion-plating deposition layer 4A is also formed over the external circumferential surface of the oil ring 4, specifically, of the side rails 4a of the oil ring 4.

The ion-plating deposition layers 2A and 4A according to the embodiment of the present invention described above are formed using a publicly known reactive ion plating method. This method is a surface treating method comprising steps of vaporizing Cr into a reactive gas such as ntirogen, ionizing it in a gaseous phase, and forming, over a basic material biased to a negative potential, a reaction product from the reactive gas and the vaporized substance ion, i.e. either a mixture of CrN and Cr2N or a mixture of CrN, $Cr_2N$, and Cr, as the case may be.

Next, testing for abrasion resistance and aggressiveness against the cylinder liner of a piston ring for internal combustion engines according to the present invention, will be discussed. Compression ring samples and oil ring samples, both of sizes appropriate to an engine, are taken for the discussion, where the number of compression rings and oil rings per cylinder is one each, and the cylinder liner is made of cast iron, specifically, a material equivalent to FC25 (Japanese Industrial Standards).

The base material for the compression rings is a stainless steel containing 17% of Cr. Three types of samples are taken, of which sample I has an ion-plating deposition layer of $Cr_2N$, 30 micrometers thick, formed over the external circumferential sliding surface of the ring base material; sample II has an ion-plating deposition layer of a mixture made of $Cr_2N$ and CrN, 30 micrometers thick, formed over the external circumferential sliding surface of the ring base material, where the mixing ratios for $Cr_2N$ and CrN are 50:50; sample III has an ion-plating deposition layer of CrN, 30 micrometers thick, formed over the external circumferential sliding surface of the ring base material.

Figure 2:
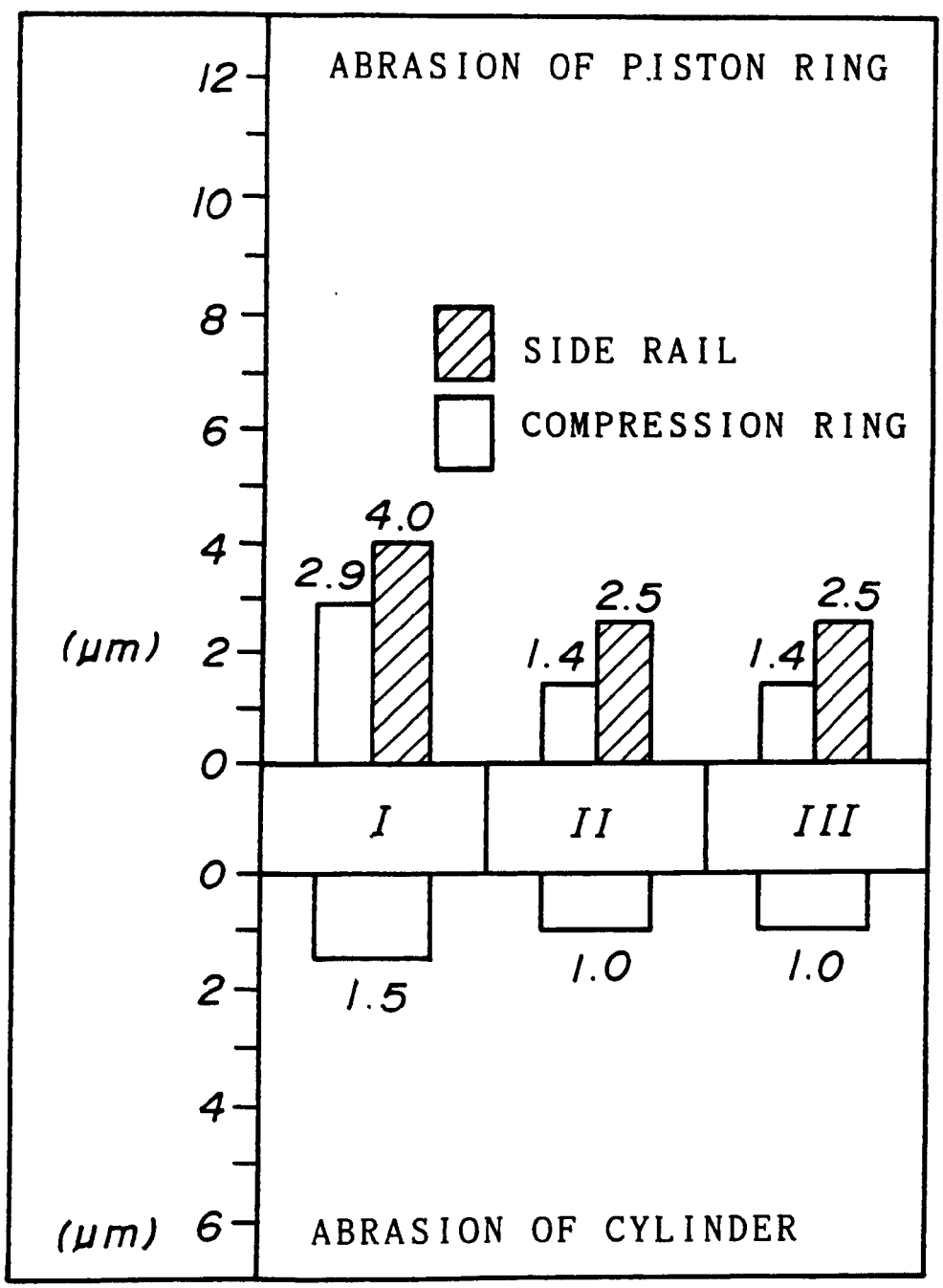
FIG. 2 is a graph of abrasion amounts for compression rings and oil rings, shown together with a graph of abrasion amounts for respective counterpart cylinders facing the compression and oil rings, all measured in a testing using an actual engine.

The samples described above were assembled into a 4-cycle water-cooled 4-cylinder 1,600-cc gasoline engine, and were run for a full load, 200-hour endurance testing. FIG. 2 is a graph showing data for abrasion amounts for the compression rings and the side rails of the oil rings, together with a graph showing data for abrasion amounts for the counterpart cylinder liner at a position near its top dead point. From FIG. 2, it has been found that, for both compression and oil rings, the sample II having an ion-plating deposition layer of the mixture made of $Cr_2N$ and CrN and the sample III having an ion-plating deposition layer of the single CrN material, are more suitable materials for abrasion resistance than the sample I having an ion-plating deposition layer of the single $Cr_2N$ material.

Although not shown, when the abrasion amount for a conventional nitrided ring is taken as 1 unit value, the abrasion amount for an ion-plated deposition layer made of CrN is approximately 1/5 unit, and the abrasion amount for an ion-plated deposition layer of a mixture made of $Cr_2N$ and CrN is approximately 1/10 unit, which means that the abrasion amount in compression and oil rings having an ion-plating deposition layer is significantly smaller than that in the rings with conventional nitriding applied thereto.

As for aggressiveness against a cylinder, abrasion amounts for cylinders after a 200-hour run were measured. The abrasion amount was 1.5 micrometers for a cylinder in sliding engagement with the sample I, 1.0 micrometer for a cylinder in sliding engagement with the sample II, and 1.0 micrometer for a cylinder in sliding engagement with the sample III. In particular, it was found that, like the sample III having an ion-plating deposition layer of CrN, the sample II having an ion-plating deposition layer of a mixture made of $Cr_2N$ and CrN, has an excellent aggressive-proofness.

Next, in order to verify the excellent property for a piston ring for internal combustion engines according to the present invention, as an individual ring, various tests were conducted for test pieces or samples 1 to 9 with various types of surface treatment applied thereto. The base material for the samples was stainless steel. As for the types of surface treatment, samples 1 to 8 used formation of an ion-plating deposition layer, 50 micrometers thick, having a mixture of composition listed in Table 1 shown below. A conventional example of sample 9 with a chrome plating layer, 50 micrometers thick, applied to is also included in the test for a comparative purpose.

Each composition ratio was determined by means of the reflection ratio by each composition component of X-ray deffraction pattern. The porosity was calculated from image processing of the microscopic sample face that was cut in the cross-sectional direction.

TABLE 1

| Sample | Composition (wt %) | | | Porosity (%) |
| --- | --- | --- | --- | --- |
| | CrN | $Cr_2N$ | Cr | |
| 1 | 40 | 60 | 0 | 0.1 |
| 2 | 50 | 50 | 0 | 1.0 |
| 3 | 95 | 5 | 0 | 18.0 |
| 4 | 50 | 45 | 5 | 0.5 |
| 5 | 85 | 5 | 10 | 12.0 |
| 6 | 65 | 15 | 20 | 0.4 |
| 7 | 85 | 5 | 10 | 8.0 |
| 8 | 85 | 5 | 10 | 25.0 |
| 9 | Chrome Plating | | | |

Abrasion Resistance Test

Figure 3:
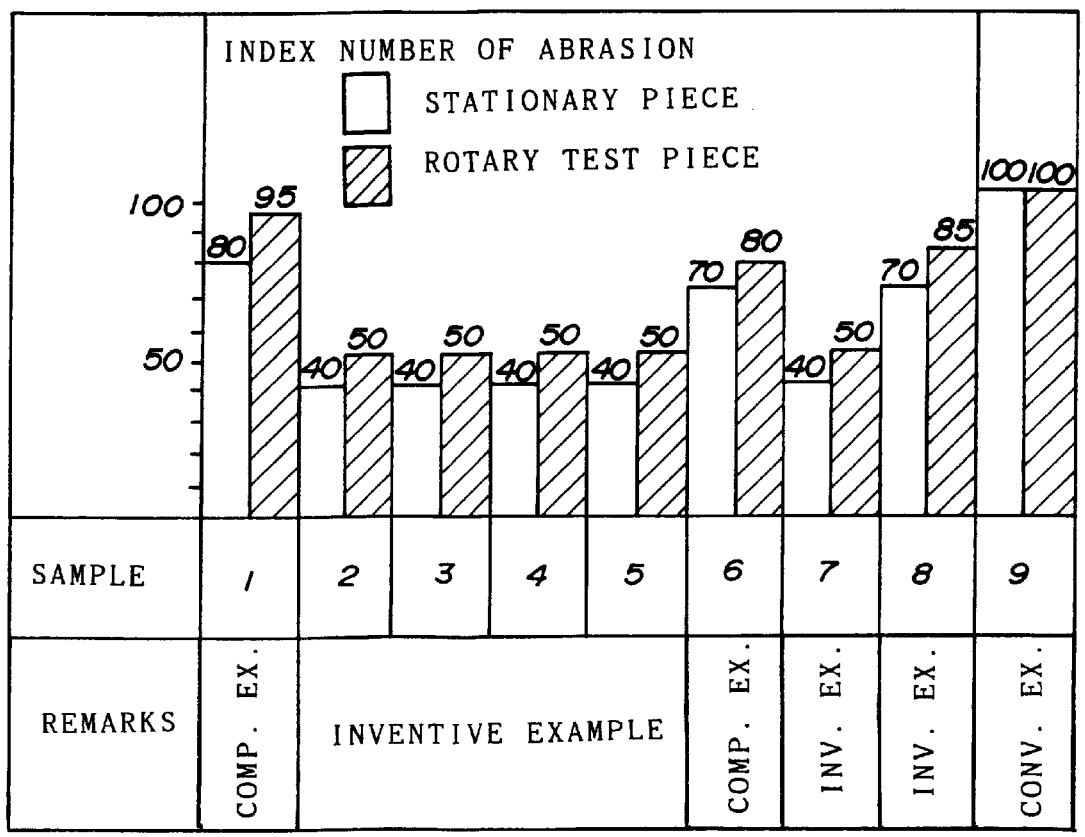
FIG. 3 is a graph of abrasion resistance for test samples with various surface treatments applied thereto., and abrasion resistance for counterpart pieces.

Abrasion resistance tests were conducted using the following testing conditions. Abrasion resistance tests are well known in the art, and, therefore, their specific procedures are not described here. The results are shown in FIG. 3, with the abrasion amount for sample 9 (conventional example of chrome plating) as a reference index of 100.

Abrasion tester: Amslar-type abrasion tester.

Rotary piece: outer diameter: 40 mm; inner diameter: 16 mm;

thickness: 10 mm; material: cast iron for cylinder liner (C: 3.2 wt. %; Si: 2.1 wt %; Mn: 0.8 wt %; P: 0.3 wt %; Cu: 0.4 wt %; Mo: 0.2 wt %; B: 0.1 wt %; Fe: the remaining wt % portion)

Stationary piece: 18 mm×15 mm×5 mm, with one from various types of deposition layer, 50 micrometers thick, formed over the surface contacting the rotary piece.

Circumferential speed: 1 m/sec.

Lubricating oil: 10W30.

Oil temperature: 80 deg. C.

Load: 150 kg.

Test running time: 7 hours.

As clearly seen from FIG. 3, when the abrasion amount for the conventional chrome plating layer is taken as a reference index of 100, abrasion index numbers for samples 2 to 5, and 7 according to the embodiment of the present invention, is 40, which means excellent abrasion resistance, and abrasion index number for the corresponding counterpart (rotary piece) is as low as 50, which means that those samples 2 to 5, and 7 are given aggressive-proofness. As for a comparative example (sample 1) with a mixing ratio of 40% for CrN, which is below the range for the embodiment, its abrasion index is 80 while that of the counterpart is 95. As for an inventive example (sample 8) with a mixing ratio of 85% for CrN, which is within the range for the embodiment, but with relatively large porosity of 25%, its abrasion index is 70 while that of the counterpart is 85. Those index numbers for samples 1 and 8 show that their abrasion resistance and aggressive-proofness remain at levels slightly, but not much, better than the chrome plating case. Another comparative example (sample 6) is shown to have its index number 70 and that of the counterpart piece is 80, which means there was little improvement in abrasion resistance.

Scuffing Resistance Test

Figure 4:
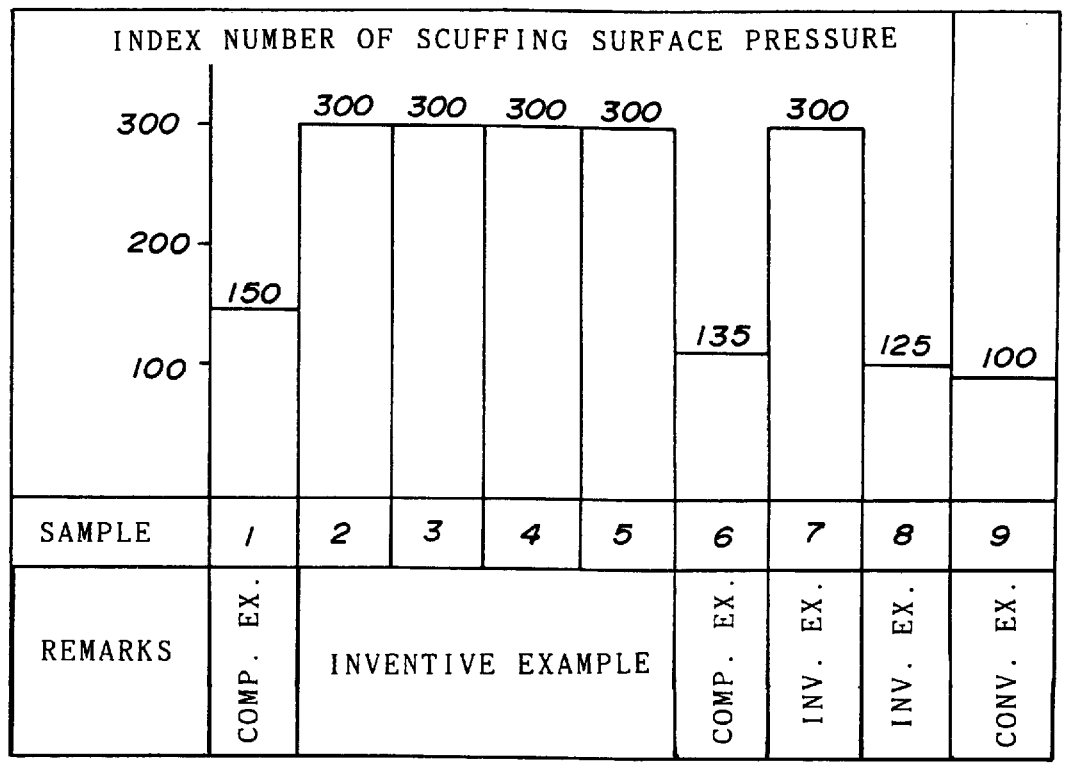
FIG. 4 is a graph of scuffing resistance for test samples with various surface treatments applied thereto, and scuffing resistance for counterpart pieces.

Scuffing resistance tests were conducted using the following testing conditions. The results are shown in FIG. 4, with the scuffing amount for sample 9 (conventional example of chrome plating) as a reference index of 100.

Abrasion tester: Amslar-type abrasion tester.

Rotary piece: outer diameter: 40 mm; inner diameter: 16 mm; thickness: 10 mm.

Stationary piece: 18 mm×15 mm×5 mm, with one from various types of deposition layer, 50 micrometers thick, formed over the surface contacting the rotary piece.

Circumferential speed: 5 m/sec.

Lubricating oil: SAE30+white kerosine (1:1).

Oil temperature: 50 deg. C.

Oil flow: 0.2 L/min.

Load: increased until the occurrence of scuffing.

In the scuffing resistance tests, rotary pieces of the same material and stationary pieces of the same surface treatment layer as in the abrasion tests described above, were used. Initially, for breaking in the sliding surface of samples or test pieces, the rotary test pieces were relatively rotated in contact with the stationary ones with under a load of surface or bearing pressure of 25 kg/cm2 for 20 minutes with lubricating oil supplied. Subsequently, the rotating tests were repeated for 2 minutes with the pressure increased to 30 kg/cm2. Thereafter, the tests were continued with the pressure increased by 5 kg/cm2 for every 2 minutes until scuffing occurs, when the load of scuffing ocurrence is measured as a limit pressure.

As clearly seen from FIG. 4, when the pressure of scuffing ocurrence for the conventional chrome plating layer (sample 9) is taken as a reference index of 100, scuffing index numbers for the samples 2 to 5, and 7 according to the embodiment of the present invention, is 300, which means excellent scuffing resistance. The comparative example (sample 1) with a mixing ratio of 40% for CrN, which is below the range for the embodiment, the comparative example (sample 6) with mixing ratios of 65% for CrN, 15% for $Cr_2N$, and 20% for Cr, which is above the range for the embodiment, and the inventive example (sample 8) with a mixing ratio of 85% for CrN, which is within the range for the embodiment, but with relatively large porosity of 25%, showed scuffing resistance index values of 150, 135, and 125, respectively, which were approximately half that of inventive examples of samples 2 to 5, and 7.

Figure 6:
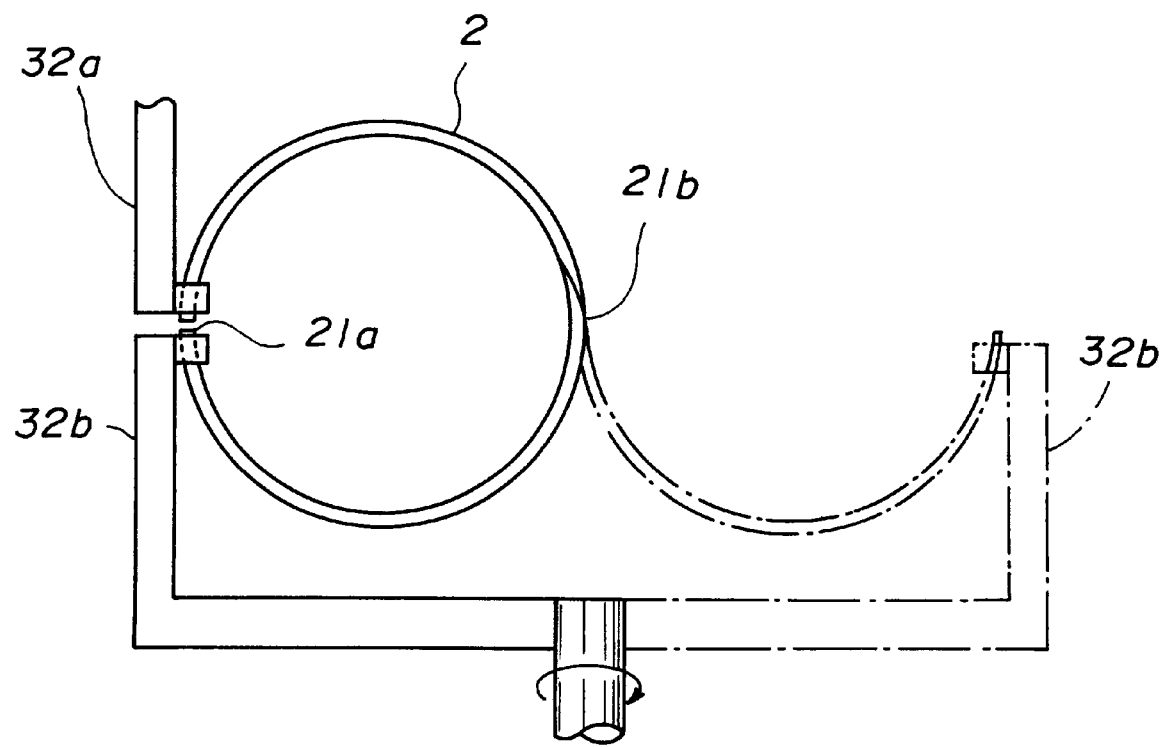
FIG. 6 is a schematic drawing showing a testing apparatus for adherence tests.

Finally, evaluation tests were conducted for adherence of an ion-plating deposition layer to its base material. For the purpose, nine piston rings of 90 mm circular diameter were produced, and the same surface layers as in the abrasion resistance and scuffing resistance tests were provided over their respective external circumferential surfaces. The thicknesses of the layers were all arranged to be 50 micrometers. The evaluation tests for adherence were conducted using a torsional peeling tester, as shown in FIG. 6.

Spedifically, the evaluation tests for adherence were conducted by means of twisting tests using the torsional peeling tester. In the twisting tests, a method was taken comprising steps of holding mutually opposing abutment ends of the abutment 21a of a piston ring 2 with holders 32a and 32b, twisting the piston ring 2 to a predetermined twisting angle by turning the holder 32b around an axis through a point 21b located on the ring 2 opposite to the abutment 21a to a position shown in phantom lines while keeping the holder 32a inits original position. After the twisting, the piston ring 2 was cut off at the point 21b opposite to the abutment 21a, and visual observation was conducted for existence of peeling of the deposition layer from the base material of the ring at the cutting plane (fracture). The results are shown in FIG. 5, with an angle where peeling occurs (peeling angle) for sample 9 (conventional example of chrome plating) as a reference index of 100.

Figure 5:
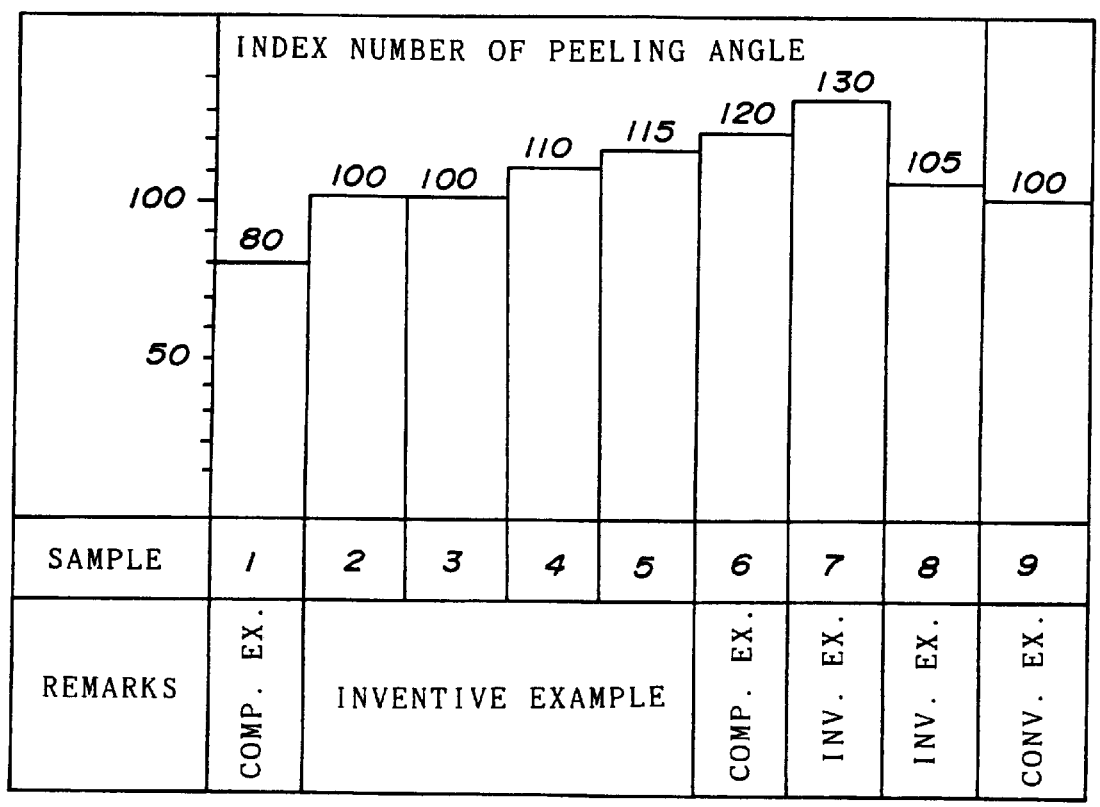
FIG. 5 is a graph of layer adherence for test samples with various surface treatments applied thereto.

As clearly seen from FIG. 5, when the peeling angle for the conventional chrome plating layer (sample 9) is taken as a reference index of 100, peeling angle index numbers (peeling-proofness or breakage-proofness index numbers) for the samples 2 to 5, 7, and 8 according to the embodiment of the present invention, are 100 to 130, which are either equal to or better than the sample 9 of chrome plating. The comparative example (sample 1) has an index number of 80, showing inferiority to the chrome plating case. The comparative example (sample 6) has an index number of 120, showing an excellent peeling-proofness. Nontheless, because the sample 6 has neither excellent abrasion resistance nor excellent scuffing resistance, as seen in FIGS. 3 and 4, this material does nor suit with use for such piston rings.

As described above, because of the ion-plating deposition layer being formed over the external circumferential surface thereof, a piston ring according to the present invention has excellent abrasion resistance, scuffing resistance, and aggressive-proofness. In addition, extraordinary advantageous effect is obtained in that peeling-proofness is also significantly improved due to synergic effect.

What is claimed is:

1. A piston ring for internal combustion engines for use with a piston and a cylinder, having an external circumferential sliding surface adapted to slide against the internal wall of said cylinder, said piston ring having an ion-plating deposition layer formed over said external circumferential sliding surface thereof, said deposition layer having pores and being made of a mixture of a first chromium nitride of CrN, a second chromium nitride of $Cr_2N$, and metallic chromium, the mixing ratios in said mixture being more than 45.0 and less than 98.0 weight percent for said first chromium nitride, more than 0.5 and not more than 15.0 weight percent for said metallic chromium, and the balance portion for said second chromium nitride, and wherein the porosity for said pores in said deposition layer made of said mixture is more than 0.5 and not more than 20.0 percent, and wherein the metallic chromium is caused to be in the intercrystal grain boundary of the CrN and $Cr_2N$.

2. The piston ring according to claim 1, wherein said piston ring is a compression ring, said compression ring being made of a base material comprising stainless steel.

3. The piston ring according to claim 1, wherein said piston ring is an oil ring, said oil ring being made of a base material comprising stainless steel.

4. The piston ring according to claim 3, wherein said oil ring includes two side rails and one spacer expander, said ion-plating deposition layer being formed on said two side rails.

* * * * *